US006683476B2

(12) United States Patent
Ali et al.

(10) Patent No.: US 6,683,476 B2
(45) Date of Patent: Jan. 27, 2004

(54) CONTACT RING ARCHITECTURE

(75) Inventors: Anwar Ali, San Jose, CA (US);
Tauman T. Lau, San Jose, CA (US);
Max M. Yeung, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 52 days.

(21) Appl. No.: 10/140,967

(22) Filed: May 8, 2002

(65) Prior Publication Data

US 2003/0210076 A1 Nov. 13, 2003

(51) Int. Cl.$^7$ .......................... H01L 25/00; H03K 19/00
(52) U.S. Cl. .......................... 326/103; 326/47; 326/102; 716/15
(58) Field of Search .......................... 326/47, 101, 102, 326/103; 361/750, 762; 716/15

(56) References Cited

U.S. PATENT DOCUMENTS 6,418,031 B1 * 7/2002 Archambeault ............. 361/762

\* cited by examiner

*Primary Examiner*—Daniel Chang
(74) *Attorney, Agent, or Firm*—Luedeka, Neely & Graham, P.C.

(57) ABSTRACT

An integrated circuit with a VDDio bus line disposed on a first layer of the integrated circuit. The VDDio bus line is disposed along a length, and has a first width transverse to the length. A VSSio bus line is dispose on a second layer of the integrated circuit. The VSSio bus line is disposed along the length and has a second width transverse to the length. The second width of the VSSio bus line substantially overlaps the first width of the VDDio bus line. An input output cell is disposed on a third layer of the integrated circuit. The first layer, the second layer, and the third layer are all different layers of the integrated circuit. The input output cell has a first transistor electrically connected to the VDDio bus line, and a second transistor electrically connected to the VSSio bus line. The first transistor and the second transistor are disposed along the length within the input output cell.

19 Claims, 2 Drawing Sheets

CONTACT RING ARCHITECTURE

FIELD

This invention relates to the field of integrated circuit design. More particularly, this invention relates to reducing the size and improving the performance of input output cells used in integrated circuits.

BACKGROUND

Input output cells deliver input signals to and carry output signals from integrated circuits, such as ASIC's and ASSP's. The input output cells are typically disposed near a peripheral edge of the integrated circuit, and are connected to bonding pads through which electrical connections are made to other elements of a larger circuit, such as a package for the integrated circuit. Regardless of the actual orientation of the input output cell, the distance between the edge of the input output cell that is nearest its associated bonding pad and the edge of the input output cell that is farthest from its associated bonding pad is typically called the height of the input output cell. The distance between the other two opposing orthogonal edges of the input output cell is typically called the width of the input output cell.

Input output cells are typically electrically connected to two electrical buses, being VDDio and VSSio. In general terms, these two buses comprise the power and ground signals used to power the input output cells. The VDDio and VSSio buses are typically disposed in two concentric rings around the peripheral edge of the integrated circuit. Because the VDDio and VSSio buses typically need to power a large number of input output cells at a high clock rate, the VDDio and VSSio buses are typically quite broad so that they have relatively small ohmic resistances and are relatively resistant to electromigration. The size of the VDDio and VSSio buses also tends to improve the integrated circuit's resistance to electrostatic discharge.

Because the VDDio and VSSio buses are broad in the same direction that the height of the input output cell is measured, and because the input output cell needs to connect to both the VDDio bus and the VSSio bus, the input output cell also tends to be relatively tall. The height of the input output cell also tends to be dictated by the size of the transistors within the input output cell, which are typically fairly large so as to accommodate higher operating voltages and the voltage spikes to which they are often subjected. As the number of devices on the integrated circuit have generally increased, and the overall size of the integrated circuit has generally decreased, the large height of the input output cells has become more of a problem when integrated circuits are laid out, in that they tend to use surface area within the integrated circuit that could more preferably be used for core devices, or eliminated altogether so as to reduce the size of the integrated circuit.

There is a need, therefore, for input output cells that have a reduced height.

SUMMARY

The above and other needs are met by an integrated circuit with a VDDio bus line disposed on a first layer of the integrated circuit. The VDDio bus line is disposed along a length, and has a first width transverse to the length. A VSSio bus line is dispose on a second layer of the integrated circuit. The VSSio bus line is disposed along the length and has a second width transverse to the length. The second width of the VSSio bus line substantially overlaps the first width of the VDDio bus line.

An input output cell is disposed on a third layer of the integrated circuit. The first layer, the second layer, and the third layer are all different layers of the integrated circuit. The input output cell has a first transistor electrically connected to the VDDio bus line, and a second transistor electrically connected to the VSSio bus line. The first transistor and the second transistor are disposed along the length within the input output cell.

In this manner, the amount of space on the surface of the integrated circuit typically required for both the first width of the VDDio bus line and the second width of the VSSio bus line is reduced to no more than about the width of the wider of the two bus lines, because the VDDio bus line substantially overlies the VSSio bus line. Further, the first transistor of the input output cell and the second transistor of the input output cell are disposed along the lengths of the VDDio bus line and the VSSio bus line, instead of along the height of the input output cell in a transverse orientation, such as is used in a typical input output cell design. Thus, the height of the input output cell is preferably substantially reduced to be no more than about the width of the greater of the first width of the VDDio bus line and the second width of the VSSio bus line. Thus, an integrated circuit design according to a preferred embodiment of the present invention allows for more surface area of the integrated circuit to be devoted to core components, greatly improving the layout of integrated circuits, especially core limited integrated circuits.

In addition, by overlying the VDDio bus line and the VSSio bus line, electrical noise, such as SSO line noise, is substantially reduced. Thus, additional elements to reduce the electrical noise, which elements required surface area on either the integrated circuit or other components of an external circuit, are no longer needed, and the surface area or other space which they occupied is freed for other purposes.

In various preferred embodiments of the invention, the input output cell has a height that is no greater than about the larger of the first width and the second width, and the input output cell substantially overlies the first width of the VDDio bus line and the second width of the VSSio bus line. In various embodiments, the third layer on which the input output cell resides either overlies both the first layer and the second layer, is disposed between the first layer and the second layer, or is disposed beneath the first layer and the second layer. The first layer may overlie the second layer, or the second layer may overlie the first layer.

Most preferably, an electrical insulation layer is disposed between the first layer and the second layer, forming a plate capacitor for intrinsically decoupling SSO noise on the VDDio bus line and the VSSio bus line. Preferably, a bond pad is electrically connected to the input output cell. The bond pad is preferably disposed between the input output cell and a peripheral edge of the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
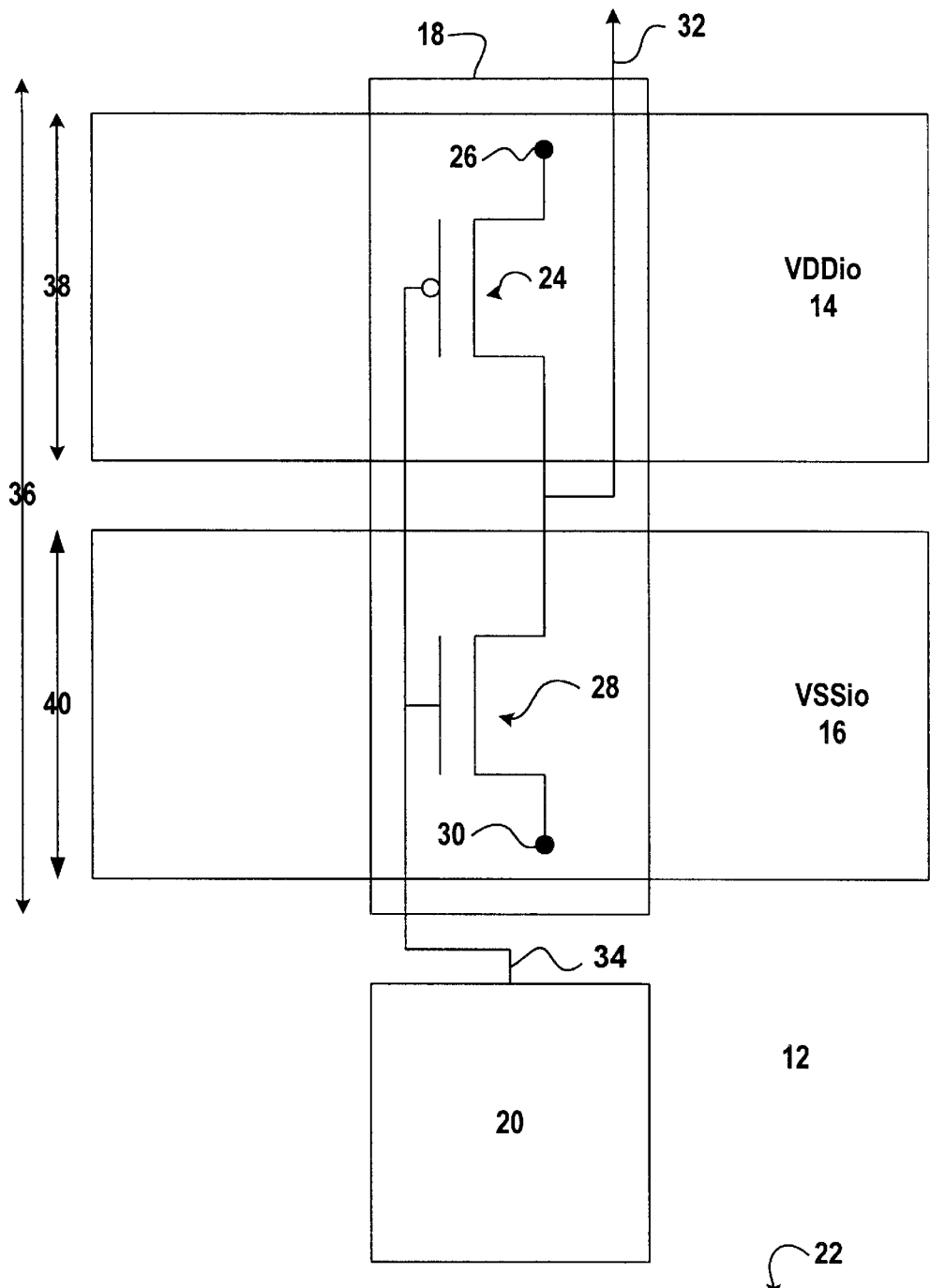
FIG. 1 is a top projection view of a prior art input output cell.

With reference now to FIG. 1, there is depicted a prior art input output cell, so that the differences between it and an input output cell according to the present invention can be more readily seen and appreciated. Depicted in FIG. 1 is a portion of an integrated circuit 10 formed on a substrate 12 having a peripheral edge 22. A VDDio bus line 14 is disposed adjacent a VSSio bus line 16 of the integrated circuit 10. The VDDio bus line 14 has a width 38 and the VSSio bus line 16 has a width 40. Each of the VDDio bus line 14 and the VSSio bus line 16 extend along a length that is relatively parallel to the peripheral edge 22 of the integrated circuit 10.

An input output cell 18 is depicted, having a first transistor 24 that makes electrical connection 26 to the VDDio bus line 14, and a second transistor 28 that makes electrical connection 30 to the VSSio bus line 16. A line 32 provides signals to and receives signals from the core of the integrated circuit 10, and the line 34 provides signals to and receives signals from the bonding pad 20. With the VDDio bus line 14 and the VSSio bus line 16 disposed in this side by side arrangement as depicted in FIG. 1, the first transistor 24 and the second transistor 28 of the input output cell 18 are disposed along the height 36 of the input output cell 18. Such a layout for the input output cell 18 makes the height 36 of the input output cell 18 at least about as tall as the combined widths 38 and 40 of the VDDio bus line 14 and the VSSio bus line 16.

Figure 2:
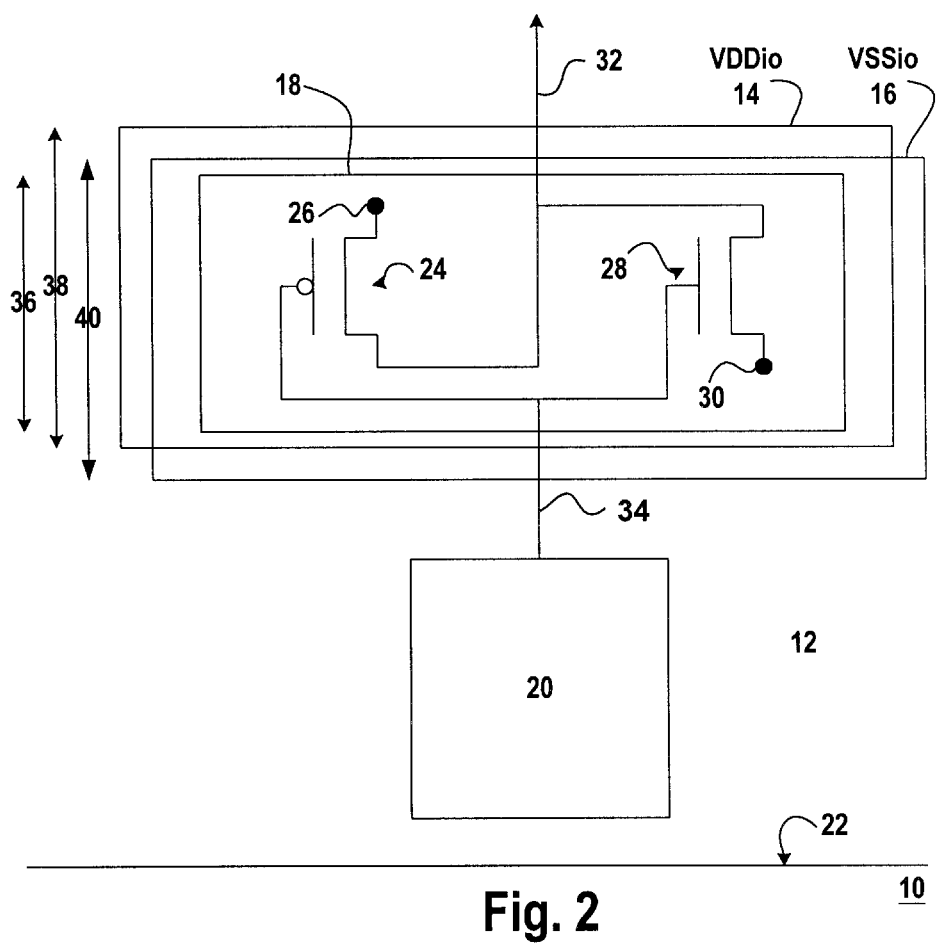
FIG. 2 is a top projection view of an input output cell according to a preferred embodiment of a design according to the present invention.

With reference now to FIG. 2, there is depicted an input output cell 18 according to a preferred embodiment of the present invention. In the embodiment of FIG. 2, the VDDio bus line 14, VSSio bus line 16, and input output cell 18 all substantially overlap each other, so as to occupy approximately the same amount of projected surface area. Electrically insulating layers that are preferably disposed between the electrically conductive layers are not depicted, so as to not unnecessarily encumber the figure, and the structures on various levels are depicted in a projected mode so as to better understand how they physically interrelate. As depicted, the VDDio bus line 14, VSSio bus line 16, and input output cell 18 are somewhat offset from each other. However, it is appreciated that this is primarily for clarity in the depiction, and is not a physical limitation. In a most preferred embodiment, the VDDio bus line 14, VSSio bus line 16, and input output cell 18 are all aligned vertically, with their top and bottom edges substantially aligned.

The VDDio bus line 14 is preferably disposed on a first layer of the integrated circuit 10, the VSSio bus line 16 is preferably disposed on a second layer of the integrated circuit 10, and the input output cell 18 is preferably disposed on a third layer of the integrated circuit 10. In a most preferred embodiment, the VSSio bus line 16 on the second layer is the lower most layer, the VDDio bus line 14 on the first layer overlies the VSSio bus line 16 on the second layer, and the input output cell 18 on the third layer overlies the other two layers. However, in alternate embodiments the VDDio bus line 14 on the first layer underlies the VSSio bus line 16 on the second layer. In further embodiments the input output cell 18 on the third layer is disposed between the VDDio bus line 14 on the first layer and the VSSio bus line 16 on the second layer.

As is evident in the embodiment depicted in FIG. 2, the width 36 of the VDDio bus line 14 substantially overlaps with the width 38 of the VSSio bus line 16. Thus, the height 36 of the input output cell 18 of the embodiment of FIG. 2 is substantially less than the height 36 of the input output cell 18 of the prior art embodiment of FIG. 1. As seen in FIG. 2, this reduction in the height 36 of the input output cell 18 is enabled at least in part by the placement of the contacts 26 and 30 of the first transistor 24 and the second transistor 28 of the input output cell 18, which are now disposed along the length of the VDDio bus line 14 and the VSSio bus line 16, rather than along the height 36 of the input output cell 18.

In this manner, the input output cell 18 of the embodiment of FIG. 2 is able to make electrical contact with the VDDio bus line 14 and the VSSio bus line 16, without having the excessive height 36 of the input output cell 18 of the prior art embodiment of FIG. 1. Further, the first transistor 24 and the second transistor 28 of the input output cell 18 do not need to be reduced in size in order to reduce the height 36 of the input output cell 18. Additionally, the width 38 of the VDDio bus line 14 and the width 40 of the VSSio bus line 16 also do not need to be reduced in order to reduce the height 36 of the input output cell 18. Thus, there is no compromise in the favorable properties of these structures in reducing the height 36 of the input output cell 18. Such a reduction in the height 36 of the input output cell 18 provides more space for core devices of the integrated circuit 10.

However, in addition to the benefit of reducing the height 36 of the input output cell 18, overlying the VDDio bus line 14 and the VSSio bus line 16 provides other benefits as well. For example, with the electrically insulating layer disposed between the VDDio bus line 14 and the VSSio bus line 16, a large plate capacitor is formed that tends to intrinsically decouple electrical noise on the VDDio bus line 14 and the VSSio bus line 16, such as SSO noise. Thus, additional structures on one or both of the integrated circuit 10 and the package in which the integrated circuit 10 is packaged are no longer necessary, and the space which such structures required on the substrate 12 is now freed for other purposes, allowing the integrated circuit 10 to be smaller and more powerful.

Electrical noise on the VDDio bus line 14 and the VSSio bus line 16 may be further reduced by having multiple VDDio bus lines 14 on different layers of the integrated circuit 10 that are alternately layered between multiple VSSio bus lines 16 on different layers of the integrated circuit 10. In this manner, several plate capacitors are formed between the alternating VDDio bus lines 14 and VSSio bus lines 16, providing additional electrical noise decoupling. In further embodiments of the present invention, the VDDcore bus line and the VSScore bus line can be similarly overlaid and duplicated, so as to similarly decouple electrical noise associated with those bus lines.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, the improvement comprising:
   a VDDio bus line disposed on a first layer of the integrated circuit, the VDDio bus line disposed along a length and having a first width transverse to the length,
   a VSSio bus line disposed on a second layer of the integrated circuit, the VSSio bus line disposed along the length and having a second width transverse to the length, the second width of the VSSio bus line substantially overlapping the first width of the VDDio bus line, and
   an input output cell disposed on a third layer of the integrated circuit, where the first layer, the second layer, and the third layer are all different layers of the integrated circuit, the input output cell having a first transistor electrically connected to the VDDio bus line and a second transistor electrically connected to the VSSio bus line, where the first transistor and the second transistor are disposed along the length within the input output cell.

2. The integrated circuit of claim 1, wherein the input output cell has a height that is no greater than about the larger of the first width and the second width.

3. The integrated circuit of claim 1, wherein the input output cell substantially overlies the first width of the VDDio bus line and the second width of the VSSio bus line.

4. The integrated circuit of claim 1, wherein the third layer on which the input output cell resides overlies both the first layer and the second layer.

5. The integrated circuit of claim 1, wherein the third layer on which the input output cell resides is disposed between the first layer and the second layer.

6. The integrated circuit of claim 1, wherein the first layer overlies the second layer.

7. The integrated circuit of claim 1, wherein the second layer overlies the first layer.

8. The integrated circuit of claim 1, wherein an electrical insulation layer is disposed between the first layer and the second layer, forming a plate capacitor for intrinsically decoupling SSO noise on the VDDio bus line and the VSSio bus line.

9. The integrated circuit of claim 1, further comprising a bond pad electrically connected to the input output cell, the bond pad disposed between the input output cell and a peripheral edge of the integrated circuit.

10. An integrated circuit, the improvement comprising:
    a VDDio bus line disposed on a first layer of the integrated circuit, the VDDio bus line disposed along a length and having a first width transverse to the length,
    a VSSio bus line disposed on a second layer of the integrated circuit, the VSSio bus line disposed along the length and having a second width transverse to the length, the second width of the VSSio bus line substantially overlapping the first width of the VDDio bus line,
    an electrically insulating layer disposed between the first layer and the second layer, where the first layer, electrically insulating layer, and second layer form a plate capacitor for intrinsically decoupling SSO noise on the VDDio bus line and the VSSio bus line, and
    an input output cell disposed on a third layer of the integrated circuit, the input output cell having a first transistor electrically connected to the VDDio bus line and a second transistor electrically connected to the VSSio bus line, where the first transistor and the second transistor are disposed along the length within the input output cell.

11. The integrated circuit of claim 10, wherein the input output cell has a height that is no greater than about the larger of the first width and the second width.

12. The integrated circuit of claim 10, wherein the input output cell substantially overlies the first width of the VDDio bus line and the second width of the VSSio bus line.

13. The integrated circuit of claim 10, wherein the third layer on which the input output cell resides overlies both the first layer and the second layer.

14. An integrated circuit, the improvement comprising:
    a VDDio bus line disposed on a first layer of the integrated circuit, the VDDio bus line disposed along a length and having a first width transverse to the length, the VDDio bus line disposed in proximity to a peripheral edge of the integrated circuit,
    a VSSio bus line disposed on a second layer of the integrated circuit, the VSSio bus line disposed along the length and having a second width transverse to the length, the second width of the VSSio bus line substantially overlapping the first width of the VDDio bus line, the VSSio bus line disposed in proximity to the peripheral edge of the integrated circuit,
    an input output cell disposed on a third layer of the integrated circuit, where the first layer, the second layer, and the third layer are all different layers of the integrated circuit, the input output cell having a first transistor electrically connected to the VDDio bus line and a second transistor electrically connected to the VSSio bus line, where the first transistor and the second transistor are disposed along the length within the input output cell and the input output cell has a height that is no greater than about the larger of the first width and the second width, the input output cell substantially overlying the first width of the VDDio bus line and the second width of the VSSio bus line, and
    a bond pad electrically connected to the input output cell, the bond pad disposed between the input output cell and the peripheral edge of the integrated circuit.

15. The integrated circuit of claim 14, wherein the third layer on which the input output cell resides overlies both the first layer and the second layer.

16. The integrated circuit of claim 14, wherein the third layer on which the input output cell resides is disposed between the first layer and the second layer.

17. The integrated circuit of claim 14, wherein the first layer overlies the second layer.

18. The integrated circuit of claim 14, wherein the second layer overlies the first layer.

19. The integrated circuit of claim 14, wherein an electrical insulation layer is disposed between the first layer and the second layer, forming a plate capacitor for intrinsically decoupling SSO noise on the VDDio bus line and the VSSio bus line.

* * * * *